United States Patent
Yang et al.

(10) Patent No.: US 12,300,600 B2
(45) Date of Patent: May 13, 2025

(54) SEMICONDUCTOR DEVICE WITH SELF-ALIGNED CONDUCTIVE FEATURES

(71) Applicant: TAIWAN SEMICONDUCTOR MANUFACTURING COMPANY, LTD., Hsinchu (TW)

(72) Inventors: Tai-I Yang, Hsinchu (TW); Wei-Chen Chu, Taichung (TW); Yung-Hsu Wu, Taipei (TW); Chung-Ju Lee, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 364 days.

(21) Appl. No.: 17/869,063

(22) Filed: Jul. 20, 2022

(65) Prior Publication Data
US 2022/0359380 A1    Nov. 10, 2022

Related U.S. Application Data

(62) Division of application No. 16/926,942, filed on Jul. 13, 2020, now Pat. No. 11,404,367, which is a
(Continued)

(51) Int. Cl.
*H01L 23/522*    (2006.01)
*H01L 21/768*    (2006.01)
(Continued)

(52) U.S. Cl.
CPC .... *H01L 23/5226* (2013.01); *H01L 21/76867* (2013.01); *H01L 21/76879* (2013.01);
(Continued)

(58) Field of Classification Search
CPC ............ H01L 23/5226; H01L 23/5222; H01L 23/5283; H01L 23/5329; H01L 23/53295; H01L 23/53209; H01L 23/53223; H01L 23/53238; H01L 23/53252; H01L 23/53266; H01L 21/76867; H01L 21/76879; H01L 21/76852; H01L 21/7682; H01L 21/76885; H01L 21/76897
See application file for complete search history.

(56) References Cited

U.S. PATENT DOCUMENTS

| 6,753,608 B2 | 6/2004 | Tomita |
| 2002/0175414 A1* | 11/2002 | Teh ..................... H01L 23/5226 257/E23.152 |

(Continued)

*Primary Examiner* — Britt D Hanley
*Assistant Examiner* — Vicki B. Booker
(74) *Attorney, Agent, or Firm* — Birch, Stewart, Kolasch & Birch, LLP

(57) ABSTRACT

A semiconductor device structure is provided. The semiconductor device structure includes a semiconductor substrate and a conductive line over the semiconductor substrate. The conductive line has a barrier region surrounding an inner portion of the conductive line, and the barrier region has a greater dopant concentration than the inner portion. The semiconductor device structure also includes a conductive via on the conductive line. The semiconductor device structure further includes a dielectric layer over the semiconductor substrate. The dielectric layer surrounds the conductive line and the conductive via.

20 Claims, 9 Drawing Sheets

Related U.S. Application Data division of application No. 15/689,784, filed on Aug. 29, 2017, now Pat. No. 10,714,421.

(51) Int. Cl.
*H01L 23/528* (2006.01)
*H01L 23/532* (2006.01)

(52) U.S. Cl.
CPC ...... *H01L 23/5222* (2013.01); *H01L 23/5283* (2013.01); *H01L 23/5329* (2013.01); *H01L 23/53295* (2013.01); H01L 23/53209 (2013.01); H01L 23/53223 (2013.01); H01L 23/53238 (2013.01); H01L 23/53252 (2013.01); H01L 23/53266 (2013.01)

(56) References Cited

U.S. PATENT DOCUMENTS

| | | | |
|---|---|---|---|
| 2003/0003765 A1* | 1/2003 | Gibson, Jr. | H01L 23/5329 257/E21.27 |
| 2004/0135255 A1 | 7/2004 | Matsunaga et al. | |
| 2008/0050874 A1 | 2/2008 | Won et al. | |
| 2008/0254600 A1 | 10/2008 | Liu et al. | |
| 2009/0166881 A1 | 7/2009 | Balakrishnan et al. | |
| 2012/0001344 A1 | 1/2012 | Takesako et al. | |
| 2014/0342549 A1 | 11/2014 | Holmes et al. | |
| 2015/0318263 A1 | 11/2015 | Yu et al. | |
| 2016/0049330 A1 | 2/2016 | Peng | |
| 2016/0111325 A1* | 4/2016 | JangJian | H01L 23/53295 257/774 |
| 2016/0118335 A1* | 4/2016 | Lee | H01L 23/53266 257/774 |

* cited by examiner

SEMICONDUCTOR DEVICE WITH SELF-ALIGNED CONDUCTIVE FEATURES

CROSS REFERENCE TO RELATED APPLICATIONS

This application is a Division of pending U.S. patent application Ser. No. 16/926,942, filed Jul. 13, 2020 and entitled "METHOD FOR FORMING SEMICONDUCTOR DEVICE WITH SELF-ALIGNED CONDUCTIVE FEATURES", which claims the benefit of U.S. patent application Ser. No. 15/689,784, filed Aug. 29, 2017 and entitled "STRUCTURE AND FORMATION METHOD OF SEMICONDUCTOR DEVICE WITH SELF-ALIGNED CONDUCTIVE FEATURES", the entirety of which are incorporated by reference herein.

BACKGROUND

The semiconductor integrated circuit (IC) industry has experienced rapid growth. Technological advances in IC materials and design have produced generations of ICs. Each generation has smaller and more complex circuits than the previous generation.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, these advances have increased the complexity of processing and manufacturing ICs. Since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
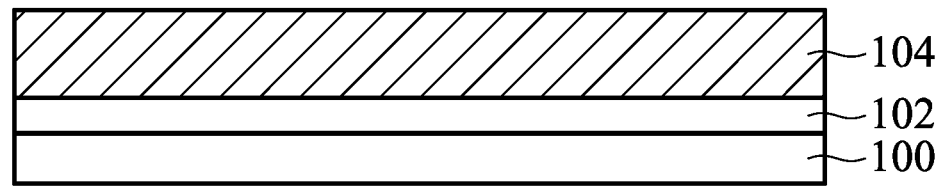
FIGS. 1A-1N are cross-sectional views of various stages of a process for forming a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

Figure 1B:
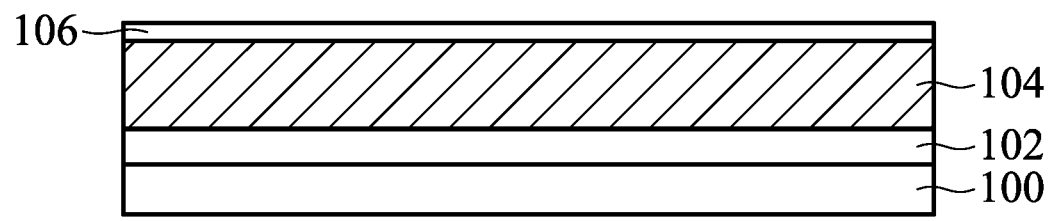
Figure 1C:
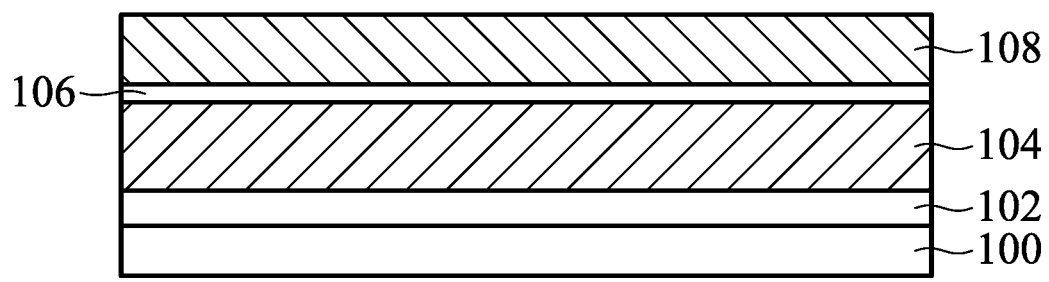
Figure 1D:
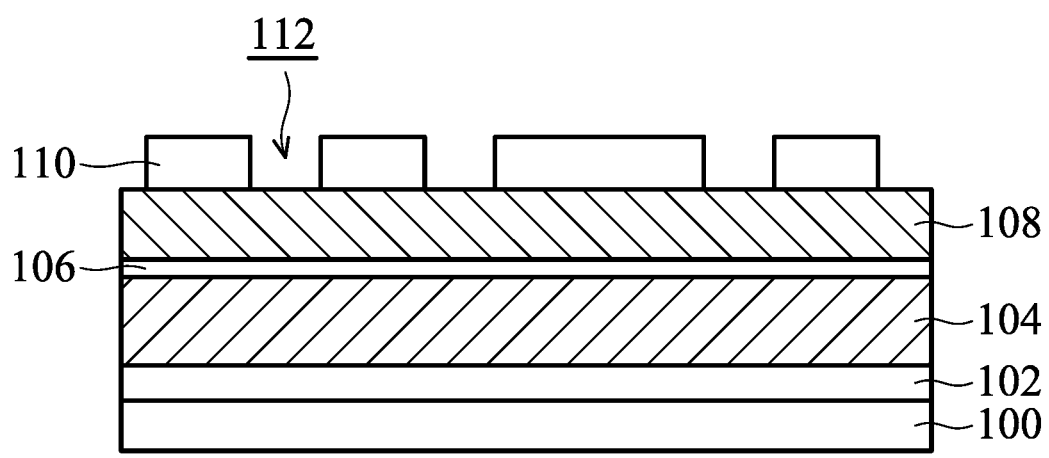
Figure 1E:
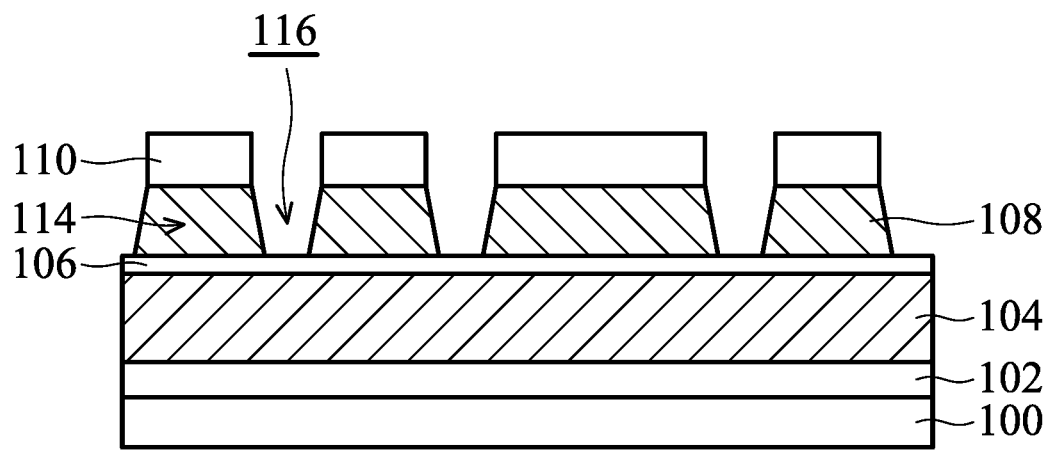
Figure 1F:
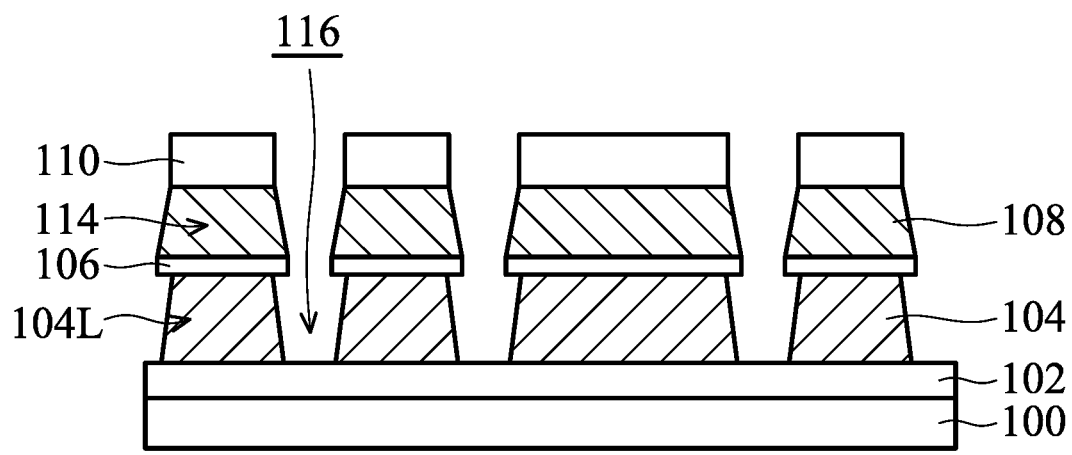
Figure 1G:
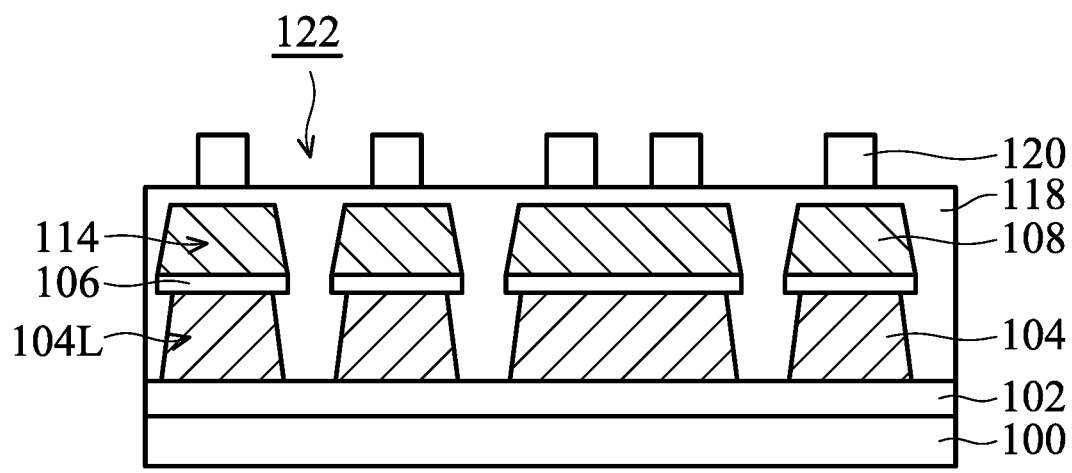
Figure 1H:
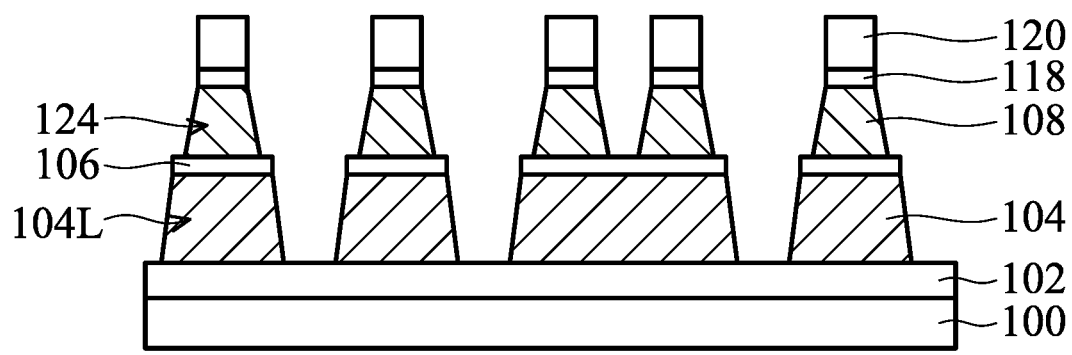
Figure 1I:
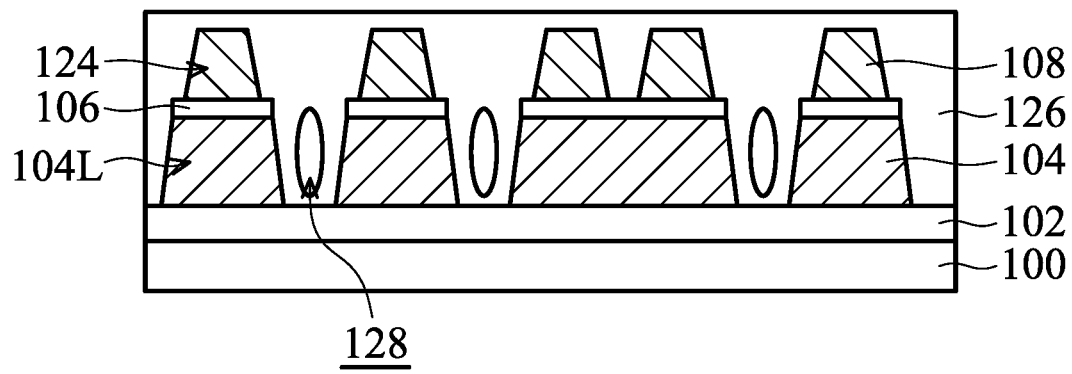
Figure 1J:
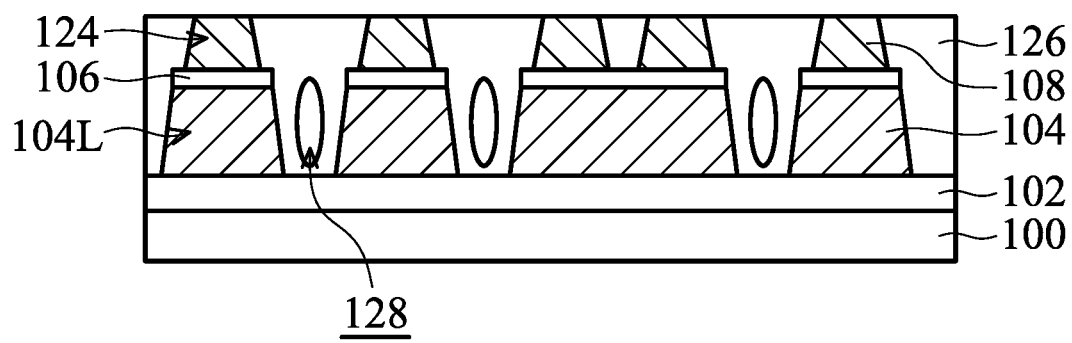
Figure 1K:
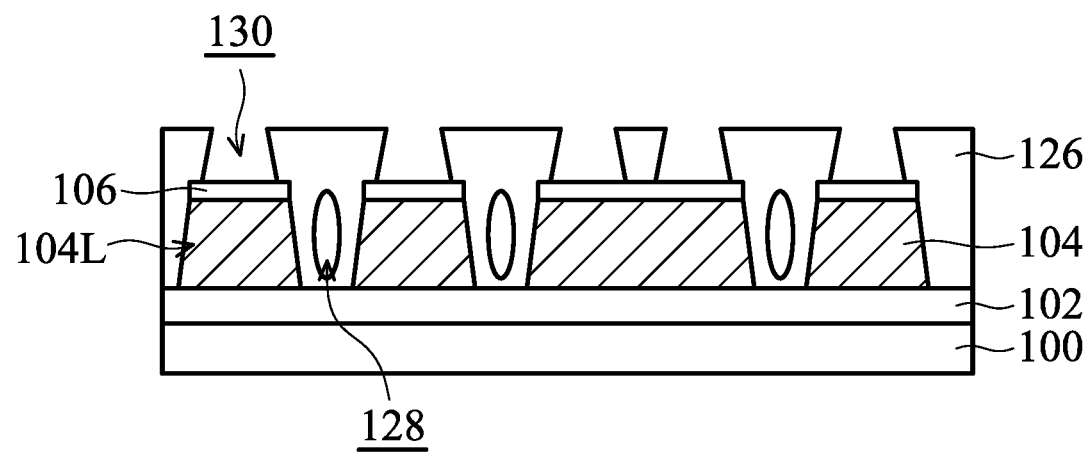
Figure 1L:
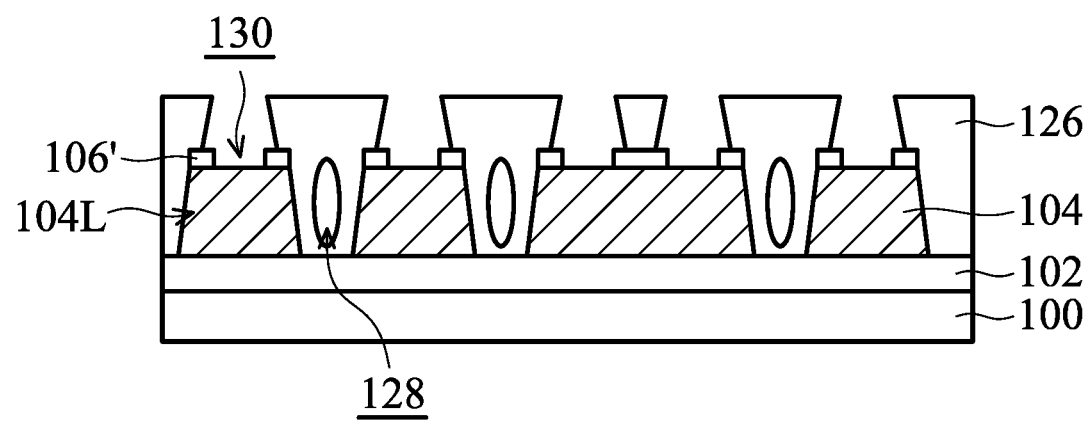
Figure 1M:
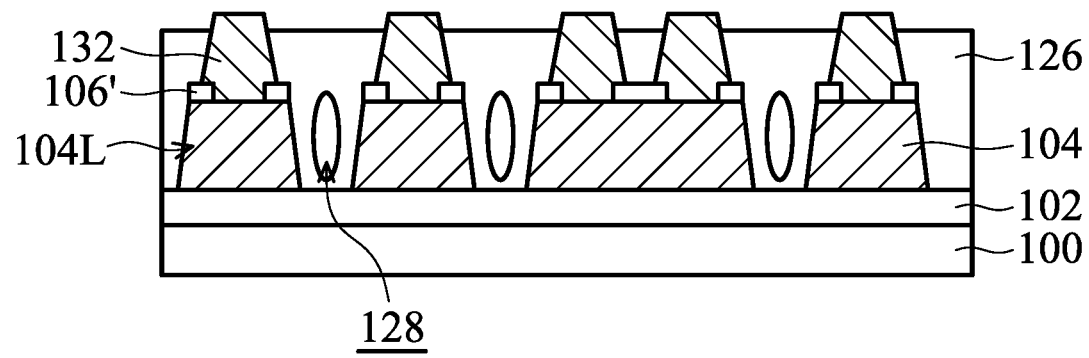
Figure 1N:
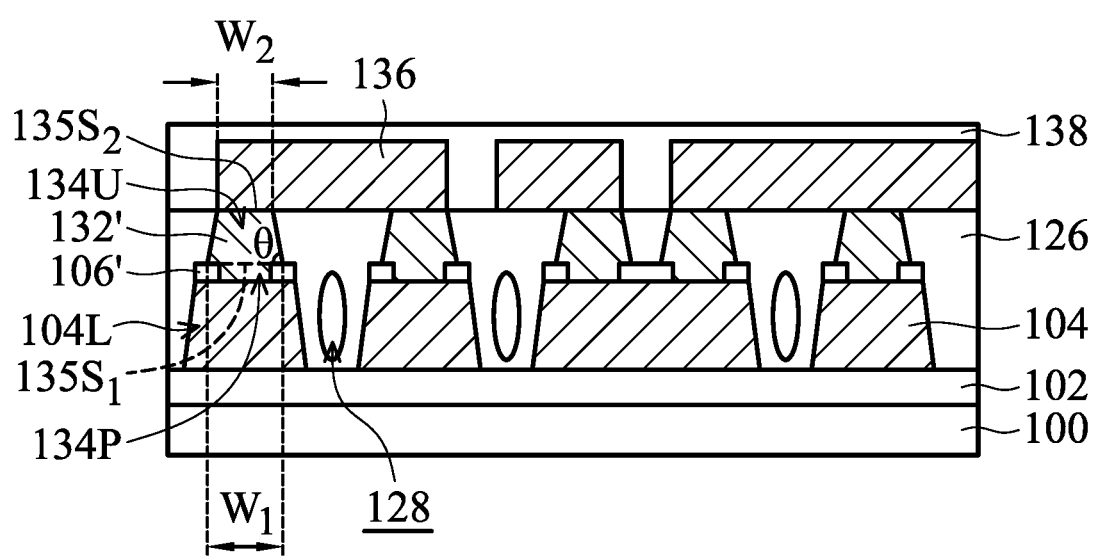

FIGS. 1A-1N are cross-sectional views of various stages of a process for forming a semiconductor device structure, in accordance with some embodiments. As shown in FIG. 1A, a semiconductor substrate 100 is received or provided. In some embodiments, the semiconductor substrate 100 is a bulk semiconductor substrate, such as a semiconductor wafer. For example, the semiconductor substrate 100 includes silicon or other elementary semiconductor materials such as germanium. In some other embodiments, the semiconductor substrate 100 includes a compound semiconductor. The compound semiconductor may include silicon carbide, gallium arsenide, indium arsenide, indium phosphide, another suitable compound semiconductor, or a combination thereof. In some embodiments, the semiconductor substrate 100 includes a semiconductor-on-insulator (SOI) substrate. The SOI substrate may be fabricated using a separation by implantation of oxygen (SIMOX) process, a wafer bonding process, another applicable method, or a combination thereof.

In some embodiments, isolation features (not shown) are formed in the semiconductor substrate 100 to define and isolate various device elements (not shown) formed in the semiconductor substrate 100. The isolation features include, for example, trench isolation (STI) features or local oxidation of silicon (LOCOS) features.

In some embodiments, various device elements are formed in and/or on the semiconductor substrate 100. Examples of the various device elements that may be formed in the semiconductor substrate 100 include transistors (e.g., metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), etc.), diodes, another suitable element, or a combination thereof. Various processes are performed to form the various device elements, such as deposition, etching, implantation, photolithography, annealing, planarization, one or more other applicable processes, or a combination thereof.

In some embodiments, a dielectric layer 102 is formed on the semiconductor substrate 100, as shown in FIG. 1A. The dielectric layer 102 may include multiple sub-layers. The dielectric layer 102 may include or be made of carbon-containing silicon oxide, silicon oxide, borosilicate glass (BSG), phosphoric silicate glass (PSG), borophosphosilicate glass (BPSG), fluorinated silicate glass (FSG), porous dielectric material, another suitable low-k dielectric material, one or more other suitable materials, or a combination thereof. In some embodiments, multiple conductive features (not shown) are formed in the dielectric layer 102. The conductive features may include conductive contacts, conductive lines, and/or conductive vias. The dielectric layer 102 and the conductive features formed therein are a portion of an interconnection structure that will be subsequently formed.

The device elements in and/or on the semiconductor substrate 100 will be interconnected through the interconnection structure to be formed over the semiconductor substrate 100. As a result, integrated circuit devices are formed. The integrated circuit devices may include logic devices, memory devices (e.g., static random access memories, SRAMs), radio frequency (RF) devices, input/output (I/O) devices, system-on-chip (SoC) devices, image sensor devices, one or more other applicable types of devices, or a combination thereof.

As shown in FIG. 1A, a conductive layer 104 is deposited over the dielectric layer 102, in accordance with some embodiments. The conductive layer 104 is used for forming conductive lines. In some embodiments, the conductive layer 104 is made of or includes copper (Cu), ruthenium (Ru), aluminum (Al), aluminum-copper alloy, cobalt (Co), tungsten (W), titanium, graphene, one or more other suitable materials, or a combination thereof. In some embodiments, the conductive layer 104 has a thickness in a range from about 200 Å to about 1000 Å.

In some embodiments, the conductive material is deposited using a chemical vapor deposition (CVD) process, a physical vapor deposition (PVD) process, an electroplating process, an electrochemical plating process, an electroless plating process, one or more other applicable processes, or a combination thereof. In some embodiments, a thermal operation is applied on the deposited conductive material to complete the formation of the conductive layer 104. The thermal operation may be performed at a temperature in a range from about 300 degrees C. to about 400 degrees C. The operation time may be in a range from about 10 minutes to about 30 minutes.

As shown in FIG. 1B, an etch stop layer 106 is deposited over the conductive layer 104, in accordance with some embodiments. In some embodiments, the etch stop layer 106 is made of or includes silicon carbide (SiC), nitrogen-doped silicon carbide, oxygen-doped silicon carbide, silicon nitride (SiN), silicon oxynitride (SiON), silicon oxide, one or more other suitable materials, or a combination thereof. In some embodiments, the etch stop layer 106 has a thickness in a range from about 10 Å to about 100 Å. In some embodiments, the etch stop layer 106 is deposited using a CVD process, a PVD process, a spin-on process, another applicable process, or a combination thereof. Embodiments of the disclosure have many variations. In some other embodiments, the etch stop layer 106 is not formed.

As shown in FIG. 1A, a sacrificial layer 108 is deposited over the etch stop layer 106, in accordance with some embodiments. In some embodiments, the sacrificial layer 108 is made of a metal-containing material. The metal-containing material may include titanium nitride, titanium oxide, titanium, tungsten, titanium-tungsten alloy, tantalum, tantalum nitride, one or more other suitable materials, or a combination thereof. In some embodiments, the sacrificial layer 108 has a thickness in a range from about 200 Å to about 1000 Å. In some embodiments, the sacrificial layer 108 is deposited by using a CVD process, a PVD process, an electroplating process, an electrochemical plating process, an electroless plating process, one or more other applicable processes, or a combination thereof.

As shown in FIG. 1D, mask elements 110 are formed over the sacrificial layer 108, in accordance with some embodiments. In some embodiments, the mask elements 110 define a line pattern for forming conductive lines. The line pattern will be transferred to the sacrificial layer 108. Afterwards, the line pattern will be transferred to the conductive layer 104 for forming conductive lines. In some embodiments, a mask layer is deposited over the sacrificial layer 108. Afterwards, the mask layer is partially removed to form openings 112. The remaining portions of the mask layer form the mask elements 110.

In some embodiments, the mask elements 110 are a patterned photoresist layer. In some embodiments, the patterned photoresist layer contains metal. In some embodiments, the mask element 110 is a metal-containing organic-inorganic hybrid. For example, the mask elements 110 are made of a mixture of one or more polymer materials and one or more inorganic materials. The inorganic materials may include zirconium oxide, titanium oxide, one or more other suitable materials, or a combination thereof. A photolithography process may be used to form the mask elements 110. The photolithography process may include photoresist coating (e.g., spin-on coating), soft baking, mask aligning, exposure (e.g., extreme ultra-violet light illumination), post-exposure baking, developing the photoresist, rinsing, drying (e.g., hard baking), one or more other suitable operations, or a combination thereof.

As shown in FIG. 1E, the sacrificial layer 108 is partially removed through the openings 112 to form multiple dummy elements 114, in accordance with some embodiments. An etching process may be used to partially remove the sacrificial layer 108. In some embodiments, the mask elements 110 are used as an etching mask, and the sacrificial layer 108 is etched to form trenches 116. Each of the trenches 116 may expose the etch stop layer 106. As a result, the dummy elements 114 are formed. The trenches 116 separate the dummy elements 114 from each other. In some embodiments, the sacrificial layer 108 is etched by using a dry etching process, a wet etching process, or a combination thereof.

In some embodiments, the etch stop layer 106 is partially removed to expose the conductive layer 104 using an etching process. The etching process may be performed in-situ in the same processing chamber where the sacrificial layer 108 is etched. Alternatively, the sacrificial layer 108 and the etch stop layer 106 are etched in different processing chambers.

As shown in FIG. 1F, the conductive layer 104 is partially removed to form multiple conductive lines 104L, in accordance with some embodiments. An etching process may be used to form the conductive lines 104L. The etching process may include a dry etching process, a wet etching process, or a combination thereof. In some embodiments, the etching process is a reactive ion etching (RIE) process. In some embodiments, the mask elements 110 and the dummy elements 114 are used as an etching mask, and the conductive layer 104 is etched such that the trenches 116 extend downwards into the conductive layer 104. The trenches 116 separate the conductive layer 104 into multiple separate conductive lines 104L. The line pattern is transferred to the conductive layer 104 to form the conductive lines 104L.

Instead of filling trenches with high aspect ratio in a dielectric layer, the conductive lines 104L are formed through etching the conductive layer 104. Therefore, the conductive lines 104L have substantially no void formed therein. The quality of the conductive lines 104L is improved.

In some embodiments, the mask elements 110 are then removed. The mask elements 110 may be removed using an ashing process, a wet striping process, one or more other applicable processes, or a combination thereof.

As shown in FIG. 1G, a planarization layer 118 is deposited over the sacrificial layer 108 to fill the trenches 116, in accordance with some embodiments. The planarization layer 118 provides a substantially planar top surface to facilitate a subsequent patterning process. The planarization layer 118 may also function as an anti-reflection layer during the subsequent patterning process. The planarization layer 118 may be made of or include a polymer-containing material. In some embodiments, the planarization layer 118 is deposited using a spin-on process, a CVD process, one or more other applicable processes, or a combination thereof.

Afterwards, mask elements 120 are formed over the planarization layer 118, as shown in FIG. 1G in accordance with some embodiments. The material and formation method of the mask elements 120 may be the same as or similar to those of the mask elements 110. Openings 122 are formed between the mask elements 120, as shown in FIG. 1G. In some embodiments, the mask elements 120 define a via pattern for forming conductive vias. The via pattern will then be transferred to the remained sacrificial layer 108 (i.e., the dummy elements 114).

As shown in FIG. 1H, the dummy elements 114 are partially removed through the openings 122 to form dummy elements 124, in accordance with some embodiments. As a result, the dummy elements 124 have the via pattern. An etching process may be used to partially remove the dummy elements 114. In some embodiments, the mask elements 120 are used as an etching mask, and the dummy elements 114 (or the sacrificial layer 108) are etched to form the dummy elements 124 having the via pattern. Each of the dummy elements 114 having the line pattern is divided into one or more dummy patterns 124 having the via pattern. In some embodiments, the dummy elements 114 are etched by using a dry etching process, a wet etching process, or a combination thereof.

Afterwards, the mask elements 120 and the planarization layer 118 are removed, in accordance with some embodiments. The mask elements 120 and the planarization layer 118 may be removed using an ashing process, a wet striping process, one or more other applicable processes, or a combination thereof.

As shown in FIG. 1I, a dielectric layer 126 is deposited over the semiconductor substrate 100 to surround or cover the dummy elements 124, the etch stop layer 106, and the conductive lines 104L, in accordance with some embodiments. The dielectric layer 126 serves as an inter-metal dielectric (IMD) layer. In some embodiments, the dielectric layer 126 is made of or includes a low-k dielectric material. The low-k dielectric material has a dielectric constant smaller than that of silicon dioxide. For example, the low-k dielectric material has a dielectric constant in a range from about 1.2 to about 3.5.

As the density of semiconductor devices increases and the size of circuit elements becomes smaller, the resistance capacitance (RC) delay time increasingly dominates circuit performance. Using a low-k dielectric material as the dielectric layer 104 is helpful for reducing the RC delay.

In some embodiments, the dielectric layer 126 includes a porous dielectric material, a spin-on inorganic dielectric, a spin-on organic dielectric, an organic polymer, an organic silica glass, SiOF series material, a hydrogen silsesquioxane (HSQ) series material, a methyl silsesquioxane (MSQ) series material, a porous organic series material, another suitable material, or a combination thereof. In some embodiments, the dielectric layer 126 includes a material containing Si, C, O, or H. For example, the dielectric layer 126 includes SiOC, SiO$_2$, SiON, SiCOH, SiOCN, or a combination thereof. In some embodiments, the dielectric layer 126 is made of or includes carbon-doped silicon oxide. The carbon-doped silicon oxide may also be referred to as organosilicate glass (OSG) or C-oxide. In some embodiments, the dielectric layer 126 is deposited using a CVD process, an atomic layer deposition (ALD) process, a spin-on process, a spray coating process, one or more other applicable processes, or a combination thereof.

In some embodiments, the thermal operation for forming the conductive lines 104L has been performed before the formation of the dielectric layer 126. The dielectric layer 126 is prevented from suffering the thermal operation. The quality of the dielectric layer 126 is therefore improved.

In some embodiments, one or more closed holes (or seams) 128 are formed in the dielectric layer 126. The closed holes 128 may be formed between sidewalls of the neighboring conductive lines 104L. The closed holes 128 may be naturally formed during the filling of the dielectric layer 126 since spacing between the neighboring conductive lines 104L is small. The closed holes 128 may further reduce the dielectric constant of the dielectric layer 126. The RC delay issue may therefore be reduced or prevented.

As shown in FIG. 1J, the dielectric layer 126 is planarized until the dummy elements 124 are exposed, in accordance with some embodiments. After the planarization of the dielectric layer 126, the top surface of the dielectric layer 126 is substantially coplanar with the top surfaces of the dummy elements 124. In some embodiments, the dielectric layer 126 is planarized by using a chemical mechanical polishing (CMP) process, a grinding process, an etching process, a dry polishing process, one or more other applicable processes, or a combination thereof.

As shown in FIG. 1K, the dummy elements 124 (the sacrificial layer 108) having the via pattern are removed to form via holes 130 in the dielectric layer 126, in accordance with some embodiments. The dummy elements 124 having the via pattern are formed from the dummy elements 114 having the line pattern. The via pattern will be self-aligned with the line pattern. Accordingly, the via holes 130 are also self-aligned with the line pattern, which means the via holes 130 are self-aligned with the conductive lines 104L. The via pattern In some embodiments, the via holes 130 expose the etch stop layer 106 which is originally covered by the dummy elements 124. In some embodiments, an etching process is used to remove the dummy elements 124. The etching process may include a dry etching process, a wet etching process, or a combination thereof.

As shown in FIG. 1L, the etch stop layer 106 is partially removed to expose the conductive lines 104L, in accordance with some embodiments. The via holes 130 are extended downward to expose the conductive lines 104L. In some embodiments, a dry etching process is used to partially remove the etch stop layer 106 and expose the conductive lines 104L. The remaining portions of the etch stop layer 106 form multiple insulating elements 106'.

In some embodiments, materials of the dielectric layer 126 and each of the insulating elements 106' are different from each other. In some embodiments, each of the insulating elements 106' has a greater etching resistance than the dielectric layer 126.

Figure 2:
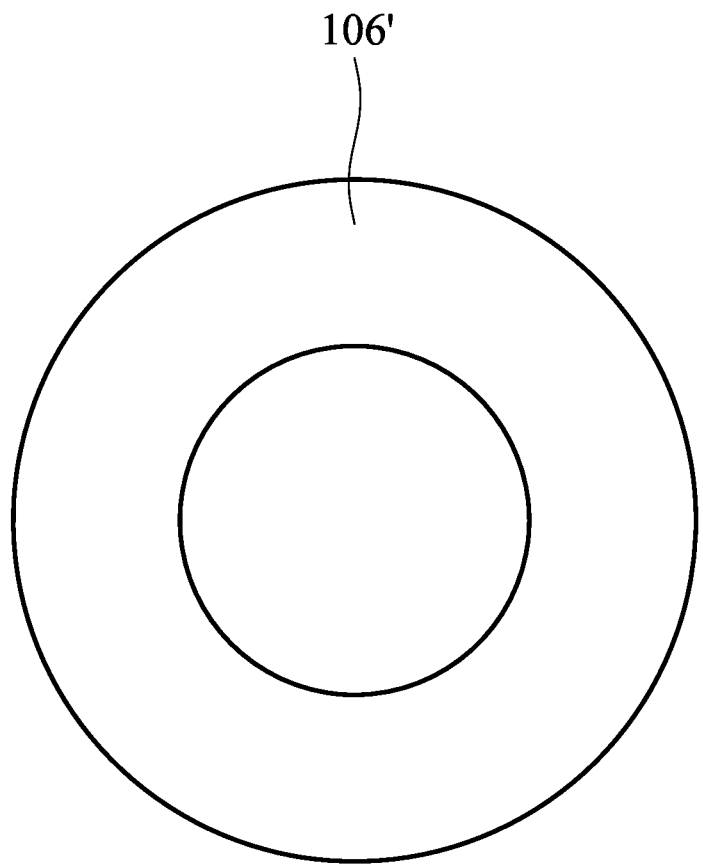
FIG. 2 is a top view of one of the insulating elements of a semiconductor device structure, in accordance with some embodiments.

FIG. 2 is a top view of one of the insulating elements 106' of the semiconductor device structure, in accordance with some embodiments. In some other embodiments, the top view of the insulating element 106' is ring-shaped. For example, the insulating element 106' has a circular ring-shape top view.

However, many variations and/or modifications can be made to embodiments of the disclosure. In some other embodiments, the etch stop layer 106 is completely removed to expose the conductive lines 104L. In these cases, no insulating element is formed on the conductive lines 104L.

As shown in FIG. 1M, conductive elements 132 are formed in the via holes 130, in accordance with some embodiments. In some embodiments, the conductive elements 126 are made of or include cobalt (Co), copper (Cu), tungsten (W), titanium (Ti), aluminum (Al), nickel (Ni), gold (Au), platinum (Pt), one or more other suitable conductive materials, or a combination thereof. In some embodiments, the conductive elements 132 protrude from the top surface of the dielectric layer 126. In some embodiments, the conductive elements 126 are deposited using an electrochemical plating process, an electroless plating process, an electroplating process, a PVD process, a CVD process, a spin-on process, one or more other applicable processes, or a combination thereof.

As shown in FIG. 1N, a planarization process is used to thin the conductive elements 132 to form conductive vias 132', in accordance with some embodiments. As mentioned above, the via holes 130 are self-aligned with the conductive lines 104L. Therefore, each of the conductive vias 132' is also self-aligned with the corresponding conductive lines 104L thereunder. A wider overlay window for forming the conductive vias 132' is obtained.

After the planarization process, the top surfaces of the conductive vias 132' are substantially coplanar with the top surface of the dielectric layer 126. In some embodiments, each of the conductive vias 132' has a single layer structure. In some embodiments, each of the conductive vias 132' is in direct contact with the conductive line 104L thereunder. In some embodiments, the materials of the conductive lines 104L and the conductive vias 132' are different from each other.

In some embodiments, each of the conductive vias 132' has an upper portion 134U and a protruding portion 134P, as shown in FIG. 1N. The protruding portion 134P extends from the bottom $135S_1$ of the upper portion 134U towards one of the conductive lines 104L directly below the corresponding conductive via 132'. In some embodiments, the bottom $135S_1$ of the upper portion 134U is wider than the top $135S_2$ of the upper portion 134U.

As shown in FIG. 1N, the bottom $135S_1$ has a width $W_1$, and the top $135S_2$ has a width $W_2$. In some embodiments, the width $W_1$ is in a range from about 13 nm to about 17 nm. In some embodiments, the width $W_2$ is smaller than the width $W_1$. The width $W_2$ may be in a range from about 10 nm to about 14 nm.

In some embodiments, each of the conductive vias 132' shrinks from along a direction from a lower portion (such as from the bottom $135S_1$) towards an upper portion (such as the top $135S_2$). In some embodiments, each of the conductive lines 104L shrinks along a direction from the bottom of the conductive line 104L towards the corresponding conductive via 132'. In some embodiments, each of the insulating elements 106' is substantially as wide as the top of the conductive line 104L thereunder. Each of the insulating elements 106' is shorter than the conductive line 104L thereunder since the bottom may be wider than the top of the conductive line 104L.

In some embodiments, each of the conductive vias 132' has an inclined sidewall. As shown in FIG. 1N, an angle θ is defined between the inclined sidewall and the bottom $135S_1$ of the upper portion 134U. The angle θ may be in a range from about 75 degrees to about 85 degrees.

As shown in FIG. 1N, each of the insulating elements 106' surrounds the protruding portion 134P of the corresponding conductive via 132', in accordance with some embodiments. In some embodiments, each of the insulating elements 106' is as thick as the protruding portion 134P of the corresponding conductive via 132'. Due to the insulating elements 106', issues related to current leakage between the neighboring conductive vias 132' are reduced or prevented.

Afterwards, one or more conductive lines 136 and a dielectric layer 138 are formed over the conductive vias 132' and the dielectric layer 126, as shown in FIG. 1N in accordance with some embodiments. In some embodiments, processes the same as or similar to those illustrated in FIGS. 1A-1M are used to form the conductive lines 136 and the dielectric layer 138. In some other embodiments, a single damascene or dual damascene process is used to form the conductive lines 136 and the dielectric layer 138. In some embodiments, the bottom of the conductive line 136 is not wider than the top of the conductive line 136.

Figure 3A:
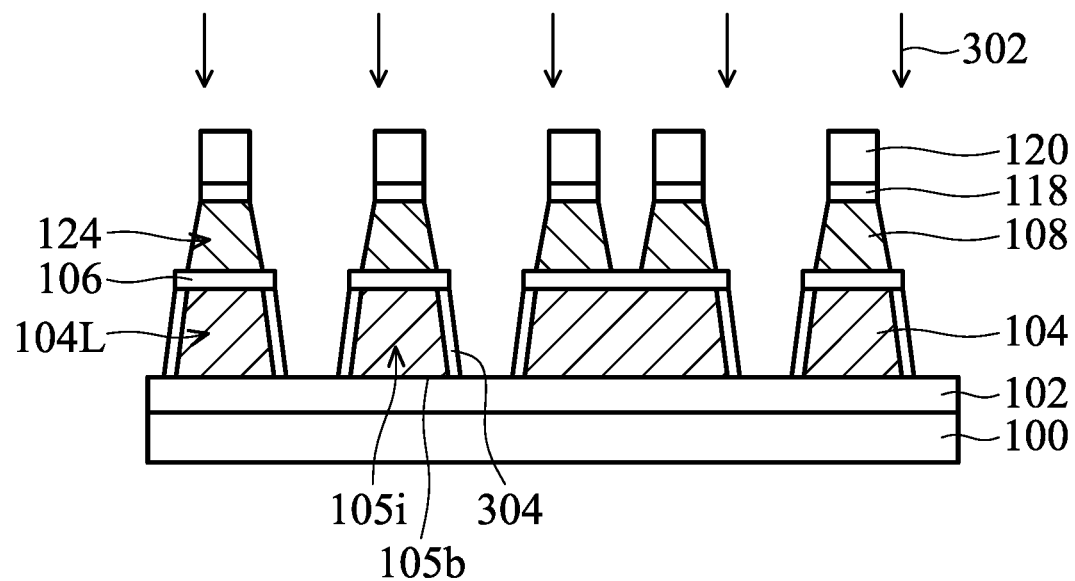
FIGS. 3A-3B are cross-sectional views of various stages of a process for forming a semiconductor device structure, in accordance with some embodiments.
Figure 3B:
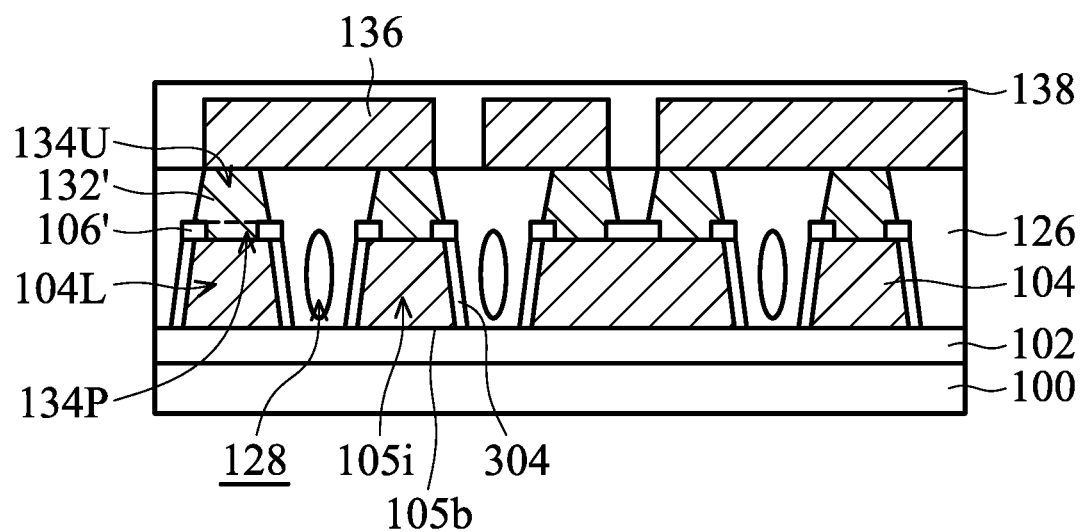

Many variations and/or modifications can be made to embodiments of the disclosure. FIGS. 3A-3B are cross-sectional views of various stages of a process for forming a semiconductor device structure, in accordance with some embodiments.

As shown in FIG. 3A, a structure the same as or similar to that shown in FIG. 1H is provided or received. In some embodiments, a doping process 302 is performed to dope surface portions of the conductive lines 104L to form barrier regions 304. The barrier regions 304 may be used to prevent metal ions (such as copper ions) of the conductive lines 104L from diffusing into a dielectric layer that will be formed. Therefore, the quality of the dielectric layer may be ensured.

The doping process 302 may include an ion implantation process, a diffusion process, one or more other applicable processes, or a combination thereof. The dopant used in the doping process 302 may include cobalt (Co), tantalum (Ta), titanium (Ti), one or more other suitable dopants, or a combination thereof.

In some embodiments, each of the barrier regions 304 surrounds an inner portion 105i of the corresponding conductive line 104L. Each of the barrier regions 304 has a greater dopant concentration than the inner portion 105i. In some embodiments, each of the barrier regions 304 does not extend across an entirety of the bottom surface 105b of the inner portion 105i.

Afterwards, processes the same as or similar to those illustrated in FIGS. 1I-1N are performed to form the structure shown in FIG. 3B, in accordance with some embodiments. The barrier regions 304 prevent metal ions of the conductive lines 104L from entering the dielectric layer 126.

Many variations and/or modifications can be made to embodiments of the disclosure. In some other embodiments, the doping process 302 is performed before the dummy elements 124 are formed. For example, the doping process 302 is performed at the stage illustrated in FIG. 1F.

Embodiments of the disclosure form a semiconductor device structure with self-aligned conductive lines and conductive vias. Dummy elements with a line pattern are used to assist in the formation of conductive lines under the dummy elements. Afterwards, the dummy elements are modified by etching to have a via pattern. Afterwards, a dielectric layer is formed to surround the conductive lines and the modified dummy elements. The modified dummy elements are removed to leave via holes that are self-aligned with the conductive lines. Conductive vias are then formed in the via holes. The semiconductor device structure with self-aligned conductive features is therefore obtained.

In accordance with some embodiments, a semiconductor device structure is provided. The semiconductor device structure includes a semiconductor substrate and a conductive line over the semiconductor substrate. The conductive line has a barrier region surrounding an inner portion of the conductive line, and the barrier region has a greater dopant concentration than the inner portion. The semiconductor device structure also includes a conductive via on the conductive line. The semiconductor device structure further includes a dielectric layer over the semiconductor substrate. The dielectric layer surrounds the conductive line and the conductive via.

In accordance with some embodiments, a semiconductor device structure is provided. The semiconductor device structure includes a substrate and a first conductive feature over the substrate. The first conductive feature shrinks along a first direction from a bottom portion of the first conductive feature towards a top portion of the first conductive feature. The semiconductor device structure also includes a second conductive feature on the first conductive feature. The second conductive feature has an upper portion and a protruding portion, the protruding portion is between the upper portion and the first conductive feature. The upper portion shrinks along the first direction, and a bottom of the upper portion is narrower than the first conductive feature. The semiconductor device structure further includes a dielectric layer surrounding the first conductive feature and the second conductive feature.

In accordance with some embodiments, a semiconductor device structure is provided. The semiconductor device structure includes a semiconductor substrate and a conductive line over the semiconductor substrate. The conductive line shrinks along a direction from a lower portion of the conductive line towards an upper portion of the conductive line. The semiconductor device structure also includes a first conductive via and a second conductive via on the conductive line. The first conductive via and the second conductive via shrink along a direction from lower portions of the first conductive via and the second conductive via respectively towards upper portions of the first conductive via and the second conductive via. The semiconductor device structure further includes an insulating element over the conductive line and surrounding the first conductive via and the second conductive via and separating the first conductive via from the second conductive via.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device structure, comprising:
   a semiconductor substrate;
   a conductive line over the semiconductor substrate, wherein the conductive line has a barrier region surrounding an inner portion of the conductive line, and the barrier region has a greater dopant concentration than the inner portion;
   a conductive via on the conductive line;
   an insulating element between the conductive via and the conductive line; and
   a dielectric layer over the semiconductor substrate, wherein the dielectric layer surrounds the conductive line and the conductive via.

2. The semiconductor device structure as claimed in claim 1, wherein the barrier region comprises Co, Ta or Ti.

3. The semiconductor device structure as claimed in claim 1, wherein a bottom of the conductive line is wider than a bottom of the conductive via.

4. The semiconductor device structure as claimed in claim 1, wherein the barrier region is in direct contact with the insulating element.

5. The semiconductor device structure as claimed in claim 1, wherein an outer sidewall of the insulating element protrudes from a sidewall of the conductive via.

6. The semiconductor device structure as claimed in claim 1, further comprising:
   a second dielectric layer between the conductive line and the semiconductor substrate.

7. The semiconductor device structure as claimed in claim 1, further comprising:
   a second conductive line on the conductive via, wherein the second conductive line is wider than the conductive line.

8. The semiconductor device structure as claimed in claim 7, wherein the second conductive line is wider than the conductive via.

9. The semiconductor device structure as claimed in claim 7, further comprising:
   a closed hole in the dielectric layer below the second conductive line.

10. A semiconductor device structure, comprising:
    a substrate;
    a first conductive feature over the substrate, wherein the first conductive feature shrinks along a first direction from a bottom portion of the first conductive feature towards a top portion of the first conductive feature;
    a second conductive feature on the first conductive feature, wherein the second conductive feature has an upper portion and a protruding portion, the protruding portion is between the upper portion and the first conductive feature, wherein the upper portion shrinks along the first direction, and a bottom of the upper portion is narrower than the first conductive feature, wherein a height of the upper portion of the second conductive feature is greater than a height of the protruding portion of the second conductive feature; and
    a dielectric layer surrounding the first conductive feature and the second conductive feature.

11. The semiconductor device structure as claimed in claim 10, wherein a height of the first conductive feature is greater than a height of the second conductive feature.

12. The semiconductor device structure as claimed in claim 10, wherein the dielectric layer includes a low-k dielectric material.

13. The semiconductor device structure as claimed in claim 10, wherein an angle between a sidewall of the upper portion of the second conductive feature and the bottom of the upper portion of the second conductive feature is from 75 degrees to 85 degrees.

14. A semiconductor device structure, comprising:
  a semiconductor substrate;
  a conductive line over the semiconductor substrate, wherein the conductive line shrinks along a direction from a lower portion of the conductive line towards an upper portion of the conductive line;
  a first conductive via and a second conductive via on the conductive line, wherein the first conductive via and the second conductive via shrink along a direction from lower portions of the first conductive via and the second conductive via respectively towards upper portions of the first conductive via and the second conductive via; and
  an insulating element over the conductive line and surrounding the first conductive via and the second conductive via and separating the first conductive via from the second conductive via, wherein lower portions of the first conductive via and the second conductive via are embedded in the insulating element, and upper portions of the first conductive via and the second conductive via protrude from the insulating element.

15. The semiconductor device structure as claimed in claim 14, further comprising:
  a dielectric layer surrounding the conductive line, the first conductive via and the second conductive via.

16. The semiconductor device structure as claimed in claim 15, wherein a portion of the dielectric layer is between the first conductive via and the second conductive via.

17. The semiconductor device structure as claimed in claim 16, wherein a height of the first conductive via is greater than a height of the portion of the dielectric layer.

18. The semiconductor device structure as claimed in claim 14, wherein the first conductive via and the second conductive via are in contact with the conductive line.

19. The semiconductor device structure as claimed in claim 14, wherein a bottom surface of the first conductive via is substantially level with a bottom surface of the second conductive via.

20. The semiconductor device structure as claimed in claim 14, wherein a top surface of the first conductive via is substantially level with a top surface of the second conductive via.

* * * * *